United States Patent
Ohmi et al.

(10) Patent No.: US 6,903,393 B2
(45) Date of Patent: Jun. 7, 2005

(54) SEMICONDUCTOR DEVICE FABRICATED ON SURFACE OF SILICON HAVING <110> DIRECTION OF CRYSTAL PLANE AND ITS PRODUCTION METHOD

(75) Inventors: Tadahiro Ohmi, 1-17-301, Komegafukuro 2-chome Aoba-ku, Sendai-shi, Miyagi (JP), 980-0813; Shigetoshi Sugawa, Sendai (JP)

(73) Assignees: Tadahiro Ohmi, Sendai (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/416,969
(22) PCT Filed: Oct. 2, 2002
(86) PCT No.: PCT/JP02/10288
§ 371 (c)(1), (2), (4) Date: May 16, 2003
(87) PCT Pub. No.: WO03/032399
PCT Pub. Date: Apr. 17, 2003

(65) Prior Publication Data
US 2004/0032003 A1 Feb. 19, 2004

(30) Foreign Application Priority Data
Oct. 3, 2001 (JP) .......................................... 2001-307899

(51) Int. Cl.[7] .......................... H01L 29/76; H01L 21/336
(52) U.S. Cl. ........................ 257/288; 257/410; 438/198; 438/788; 438/792
(58) Field of Search ................................. 257/288, 368, 257/410, 411; 438/197, 198, 786–788, 792, 791

(56) References Cited

U.S. PATENT DOCUMENTS

| 3,476,991 A | 11/1969 | Mize et al. | |
|---|---|---|---|
| 5,317,175 A | 5/1994 | Throngnumchai | |
| 6,586,792 B2 * | 7/2003 | Ahn et al. | 257/295 |
| 6,661,058 B2 * | 12/2003 | Ahn et al. | 257/344 |

FOREIGN PATENT DOCUMENTS

| EP | 354449 | 2/1990 | |
|---|---|---|---|
| EP | 1 174 928 A1 * | 1/2002 | H01L/29/78 |
| JP | 61-70748 | 4/1986 | |
| JP | 2000-286418 | 10/2000 | |
| JP | 2001-160555 | 6/2001 | |
| WO | WO 00/60671 * | 12/2000 | H01L/29/78 |

OTHER PUBLICATIONS

Hirayama, M., et al., Low–Temperature Growth of High–Integrity Silicon Oxide Films by Oxygen Radical Generated in High–Density Krypton Plasma, IEEE IEDM Tech. Digest, Dec. 1999, pp. 249–252.*

Wolf, et al., Silicon Processing for the VLSI Era, Vol. 1, Process Technology, 1986, Lattice Press, pp. 182–211.*

* cited by examiner

Primary Examiner—T. N. Quach
(74) Attorney, Agent, or Firm—Crowell & Moring LLP

(57) ABSTRACT

In a semiconductor device in which a plurality of field effect transistors are formed on a silicon surface having substantially a <110> orientation, the field effect transistors are disposed on the silicon surface such that a direction connecting a source region and a drain region of the field effect transistor is coincident to a substantially <110> direction.

9 Claims, 7 Drawing Sheets

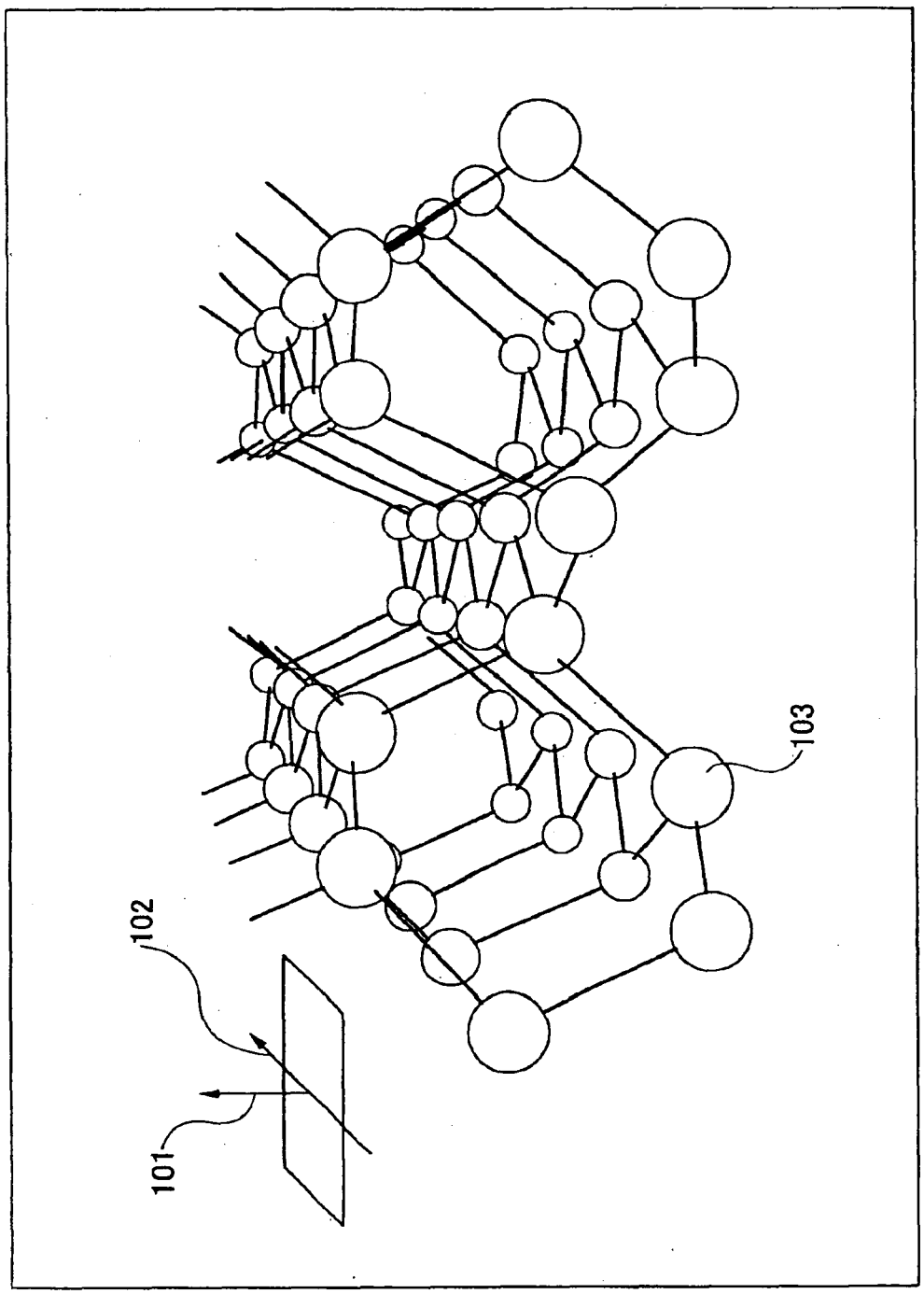

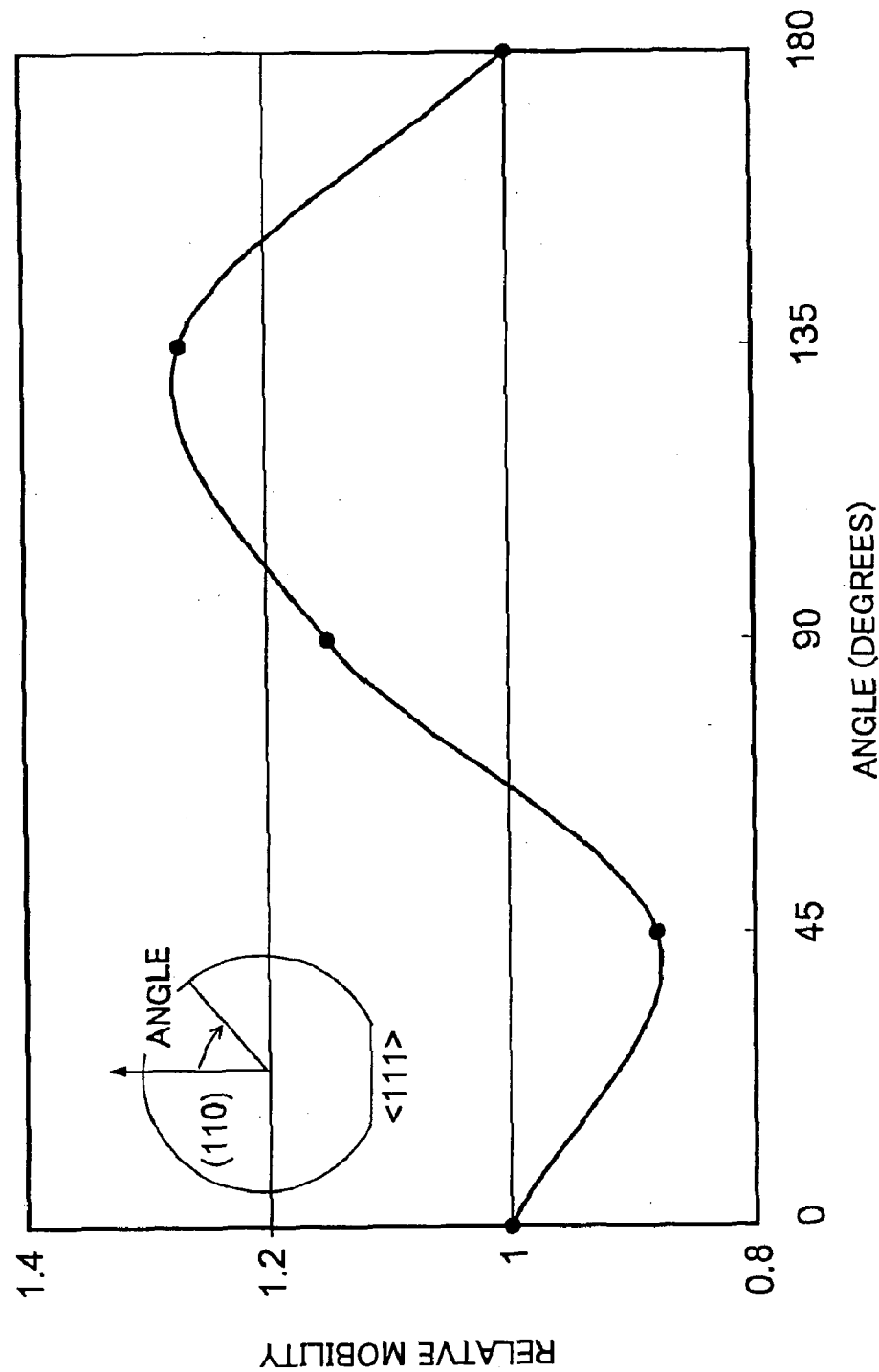

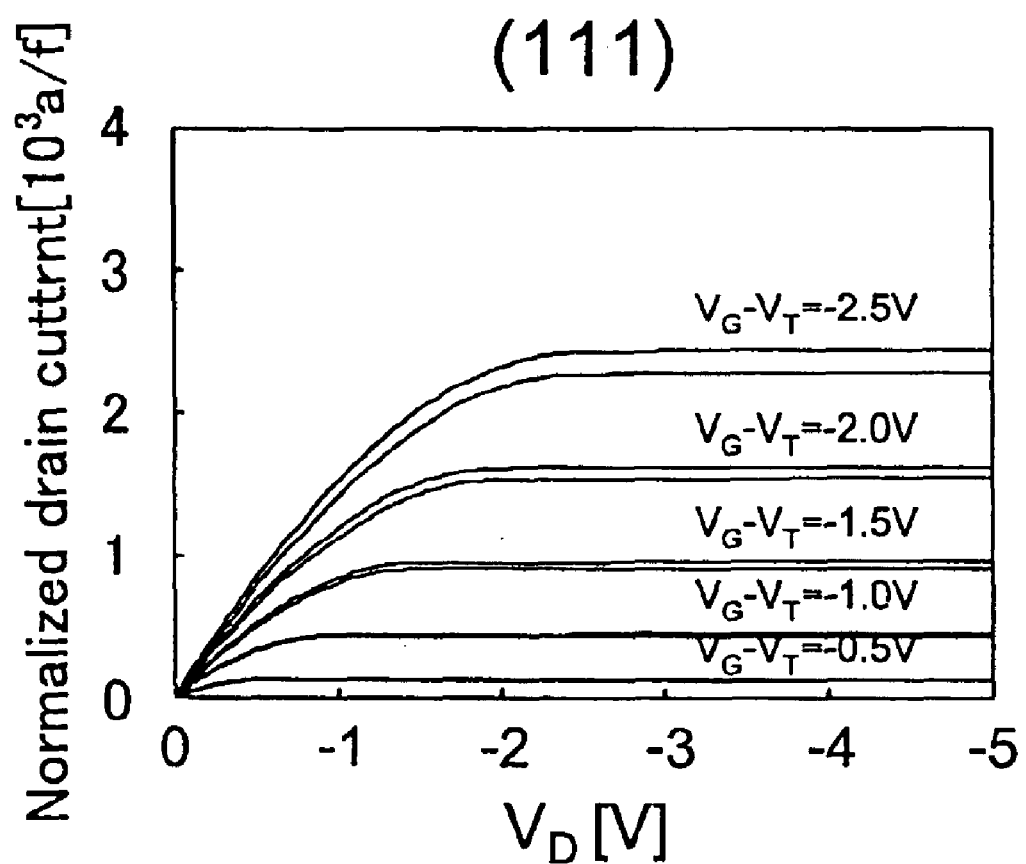

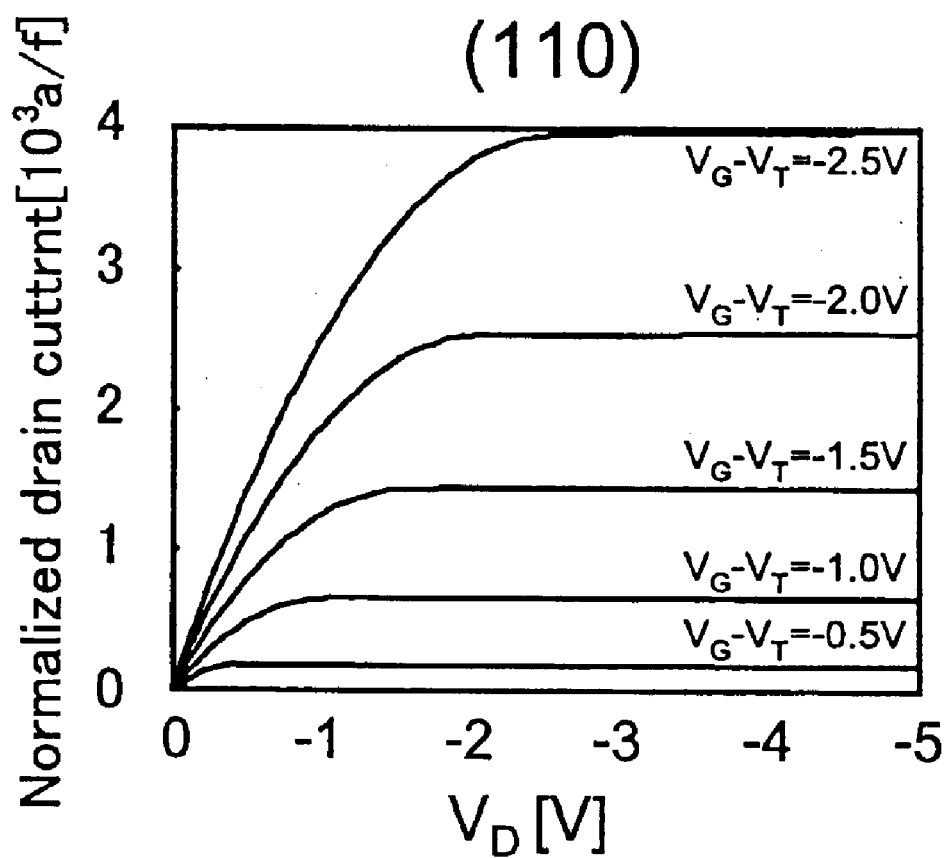

SEMICONDUCTOR DEVICE FABRICATED ON SURFACE OF SILICON HAVING <110> DIRECTION OF CRYSTAL PLANE AND ITS PRODUCTION METHOD

TECHNICAL FIELD

The present invention generally relates to semiconductor devices and more particularly to a semiconductor device formed on a silicon substrate having a <110> surface orientation or a surface orientation near this surface orientation.

BACKGROUND ART

Conventionally, field effect transistors of MIS (metal/insulator/silicon) type have been formed on a silicon substrate having a <100> surface orientation. This was because high electric performance and high reliability, such as excellent insulator/silicon interface characteristics, excellent breakdown characteristics, or excellent leakage characteristics of oxide film, could be achieved only in the case a <100>-oriented silicon is used in a thermal oxidation process (conducted generally at 800° C. or more), which has been used conventionally for forming a gate insulation film of field effect transistors. Herein, the surface orientation is defined such that a <100> direction encompasses all the directions crystallographically equivalent to a [100] direction, such as [100] direction, [010] direction, [001] direction, and the like. Similarly, a <100> surface is used in the present invention as encompassing all the crystal surfaces crystallographically equivalent to a (100) surface, such as (100) surface, (010) surface, and (001) surface.

Conventionally, it has been known that the mobility, and hence current drivability, of a field effect transistor changes depending on the surface orientation of silicon. On the other hand, no reliable experimental knowledge has been obtained so far with regard to the surface orientation that provides maximum mobility by way of attempt of choosing a surface orientation of higher mobility by forming a gate oxide film on silicon oriented in a surface orientation other than the <100> surface, because of large interface state density formed at the oxide/silicon interface as compared with the case of the silicon oxide film formed on the silicon surface oriented in the <100> orientation, and in view of poor breakdown characteristics and poor leakage characteristics of such a gate oxide film.

Meanwhile, it has been discovered, in Japanese Laid-Open Patent Publication 2001-16055, that it is possible to form a high-quality silicon oxide film, silicon oxynitride film or a silicon nitride film, on a silicon surface of any surface orientation, including the silicon surface having a <111> surface orientation, at low temperature such as 400° C. by using microwave-excited plasma. However, this prior art is entirely silent about dependency of mobility of a field effect transistor on the silicon surface orientation. Thus, there has been no knowledge so far of forming a field effect transistor structure of high mobility by choosing surface orientation of silicon surface.

DISCLOSURE OF THE INVENTION

Accordingly, it is a general object of the present invention to provide a novel and useful semiconductor device and fabrication process thereof wherein the foregoing problems are eliminated.

Another and more specific object of the present invention is to provide a semiconductor device formed on a silicon surface of <110> surface orientation and fabrication process thereof.

Another object of the present invention is to provide a semiconductor device in which a plurality of field effect transistors are formed on a silicon surface having substantially a <110> orientation, characterized in that the field effect transistors are disposed on the silicon surface such that a direction connecting a source region and a drain region of said field effect transistor is coincident to a substantially <110> direction.

Another object of the present invention is to provide a fabrication method of a semiconductor device including therein a plurality of field effect transistors on a silicon surface having substantially a <110> orientation in such a manner that the direction connecting a source region and a drain region of the field effect transistor is coincident to a substantially <110> direction, characterized in that a gate insulation film of the field effect transistor is formed by using a mixed gas plasma of a rare gas and a gas that forms an insulation film, the mixed gas plasma being formed by microwave excitation.

According to the present invention, it becomes possible to provide a field effect transistor of high mobility, by forming a MIS transistor such that the MIS transistor uses a gate insulation film of a silicon oxide film, silicon oxynitride film or a silicon nitride film, formed on a silicon substrate or a silicon surface having substantially a <110> surface orientation, in such a manner that the direction connecting the source region and the drain region becomes substantially coincident to the <110> surface direction.

Further, according to the present invention, it becomes possible to increase the current drivability of a transistor up to five times the current drivability of a conventional transistor that uses a silicon gate oxide film, without miniaturizing the device, by forming the MIS transistor having particularly a silicon nitride film on a silicon substrate or silicon surface having a substantially <110> orientation, for the gate insulation film, such that the direction connecting the source region and the drain region coincides substantially with the <110> surface direction. As a result, the MIS transistor of the present invention is operable at high speed without deteriorating the breakdown characteristics, and it becomes possible to-increase the product of high-frequency cutoff frequency and device breakdown voltage (fT.BVbd product) of a silicon CMOS integrated circuit up to five times as compared with the conventional case. This means that it has become possible to realize a high-speed integrated circuit exceeding a silicon germanium transistor or a gallium arsenide transistor while using a silicon CMOS device.

Further, by increasing the channel width five times without changing the channel length of the MIS transistor, it becomes possible to reduce the device area by ½ or less as compared with the conventional MIS transistor having a silicon gate oxide film formed on a (100) surface, without sacrificing the current drivability. Thereby, it becomes possible to realize a low power integrated circuit in which the power consumption is reduced to ¼. Further, by increasing the channel length five times without changing the channel width in the MIS transistor, it becomes possible to reduce the variation of the threshold voltage to ½ or less, the 1/f noise to ½ or less, and the thermal noise to ½ or less as compared to the conventional MIS transistor that has a silicon gate oxide film on the (100) surface, without sacrificing the current drivability. Thereby, a high-precision integrated circuit can be formed.

BRIEF DESCRIPTION OF THE DRAWINGS

FIG. 1 is a schematic view showing the crystal structure of a silicon substrate of a <110> surface orientation on which a field effect transistor is formed;

FIG. 2 is a diagram showing the orientation dependence of transistor mobility for the case a P-type MIS transistor is formed on a <110> surface;

FIGS. 3A–3C are diagrams showing the surface orientation dependence of current-voltage characteristics of the MIS transistor;

DETAILED DESCRIPTION OF THE PREFERRED EMBODIMENTS

[Principle]

Figure 3A:
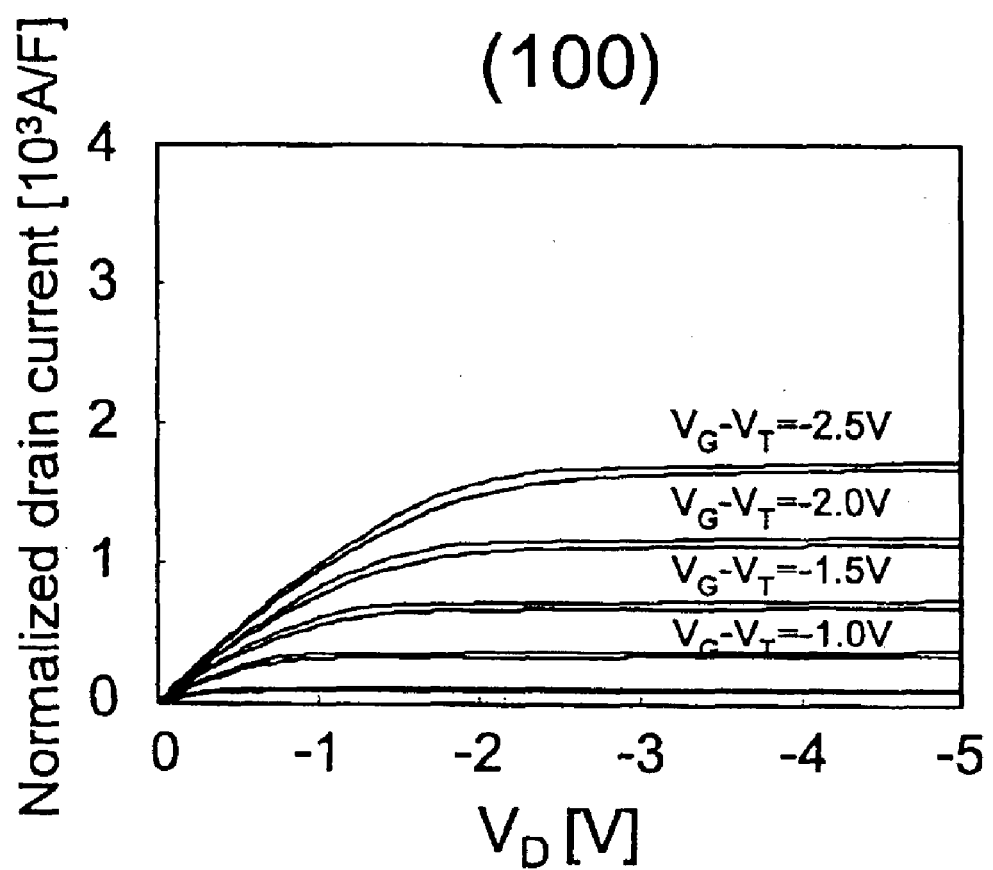

It is possible to form a high-quality gate insulation film on a silicon surface of all surface orientations at low temperature such as 400° C., by using a mixed gas plasma of a rare gas and a gas that forms an insulation film, induced by microwave excitation. As a result of detailed investigations conducted on the silicon surface orientation dependence of a field effect transistor by using this technology and thus constituting the foundation of the present invention, the inventor of the present invention has discovered the fact that the mobility of the electric field transistor becomes maximum in the case the field effect transistor is disposed on a silicon surface of a <110> orientation in such a manner that the direction from the source region to the drain region coincides with the <110> orientation.

According to the present invention made based on the foregoing discovery, it becomes possible to increase the mobility for both N-type MIS transistor and P-type MIS transistor and that a highly reliable transistor is obtained such that the transistor has a mobility of about 1.4 times as large as a MIS transistor formed on a silicon substrate having the <100> orientation for the case of an N-type MIS transistor. In the case of a P-type MIS transistor, it is possible to obtain a mobility of about 2.5 times as large as such a MIS transistor formed on a silicon substrate having the <100> orientation.

Further, according to the present invention, it is possible to use, in addition to a conventional silicon oxide film, a silicon oxynitride film or a silicon nitride film having a larger dielectric constant as compared with a silicon oxide film, for the gate insulation film. Thereby, it becomes possible to increase the current drivability of the transistor in proportion with the dielectric constant. It should be noted that a silicon nitride film has a dielectric constant twice as large as that of a silicon oxide film. Thus, by using a silicon nitride film for the gate insulation film of a MIS transistor and further by choosing the surface orientation as set forth in the present invention, it becomes possible to achieve a highly reliable field effect transistor having a current drivability larger than that of a transistor having a silicon oxide of the same thickness formed on a (100) surface, by a factor of about 2.8 in the case of an N-type MIS transistor or a factor of about 5 in the case of a P-type MIS transistor.

In once example of the arrangement in which the source region and the drain region are disposed on a <110> oriented silicon surface such that the direction connecting the source region and the drain region coincides the <110> direction, it should be noted that the gate electrode may be disposed on a silicon substrate having a principal surface of a (110) orientation such that the elongating direction of the gate electrode coincides with [001] direction, and such that the source region is disposed within the foregoing (110) surface at the side of the [1-10] direction with respect to the gate electrode, and that the drain region is disposed within the (110) surface at the side of the [−110] direction. Further, the present invention includes all the crystallographically equivalent arrangements equivalent to the foregoing. It should be noted that this construction is equivalent also to the construction in which the gate electrode is disposed in such a manner that the elongating direction of the gate electrode coincides with the direction rotated by 135 degrees within the (1-10) surface with reference to an intersection line of the (111) surface.

Herein, it should be noted that the representation "substantially <110> direction" is not limited to the (110) surface itself or to the {110} surfaces that include all the crystallographically equivalent surfaces thereto, but it also includes the surface orientations approximately equal to the (110) surface crystallographically. Thus, surfaces such as a (551) surface, a (331) surface, a (221) surface, a (553) surface, a (335) surface, a (112) surface, a (113) surface, a (115) surface, a (117) surface, and the like, have the pertinent surface orientation. Further, it is also possible to choose the surfaces such as a (320) surface, a (531) surface, a (321) surface, a (533) surface, a (535) surface, a (230) surface, a (351) surface, a (231) surface, a (353) surface, a (355) surface, and the like, in which the angular deviation from the <110> direction is small enough, also as the crystal surface in which the effect of the present invention is achieved.

[First Embodiment]

As a first embodiment of the present invention, description will be made on a semiconductor device in which a MIS type field effect transistor having a gate insulation film of silicon oxide is formed on a silicon substrate having a <110> orientation.

FIG. 1 is a schematic diagram showing the crystal structure of a silicon crystal constituting the silicon substrate used in the field effect transistor of the present invention, wherein FIG. 1 shows the crystal structure as viewed in the <110> direction. In FIG. 1, both of arrows 101 and 102 represent the <110> direction, and it can be seen that the silicon atoms 103 are arranged parallel to the interface to the gate insulation film at the uppermost surface part thereof on which the field effect transistor is formed.

Further, the MIS transistor of the present embodiment includes a gate electrode of the field effect transistor on the <110>-oriented principal surface of the silicon substrate such as the (110) surface, such that the gate electrode extends from the right to the left on the plane of FIG. 1. Thereby, the source region is disposed closer with respect to the plane of the drawing, while the drain region is disposed farther with respect to the plane of the drawing. It should be noted that this direction is the direction in which the field effect transistor is disposed such that the line connecting the source region and the drain region coincides the <110> orientation. As will be shown in FIG. 2, the mobility of the MIS transistor becomes maximum in this direction.

FIG. 2 shows the dependence of the mobility on the transistor orientation for the case a P-type MOS transistor is formed on the (110) surface, wherein FIG. 2 represents the change of mobility for the case the angle of elongating direction of the gate electrode is changed within the (1-10) surface with reference to an intersection line of the (1-10) surface to the (111) surface.

Referring to FIG. 2, it can be seen that the mobility becomes maximum in the case the source region and the drain region are disposed such that the angle formed by the elongating direction of the gate electrode becomes 135 degrees. In other words, the mobility becomes maximum in the case the source and drain regions are disposed within a (110) surface or {110} surfaces such that the direction connecting the source region and the drain region coincides the <110> direction. A similar situation holds also in the case of a N-type MIS transistor. It should be noted that the mobility of the MIS transistor thus disposed is increased by about 1.4 times for the case of an N-type MIS transistor or about 2.5 times for the case of a P-type MIS transistor as compared with the MIS transistor mobility in the <100> surface. It should be noted that such an increase of the mobility of the MIS transistor disposed in such an orientation is caused by the reduction of effective mass and lattice scattering probability of electrons and holes along the path from the source region to the drain region.

As can be seen from FIG. 2, there occurs no sharp decrease of mobility in the angles slightly offset from the angle in which the mobility becomes maximum. Thus, it is possible to obtain a field effect transistor of improved mobility when the crystal orientation within ±10 degrees from the 135 degree angle is chosen. Thus, the field effect transistor of the present invention can be formed also on surfaces having a surface orientation angle substantially equal to or close to the (110) surface or <110> surfaces, such as a (551) surface, a (331) surface, a (221) surface, a (321) surface, a (532) surface, a (231) surface, a (351) surface, (a 320) surface, a (230) surface, and the like.

FIGS. 3A–3C show the dependence of a drain region current of the P-type MIS transistor on the drain region voltage. It can be seen that the current drivability of the MIS transistor formed on the (111) surface shown in FIG. 3B and the current drivability of the MIS transistor formed on the (110) surface shown in FIG. 3C are increased with respect to the current drivability of the (100) surface shown in FIG. 3A by the factors of 1.3 and 2.5, respectively.

Figure 4:
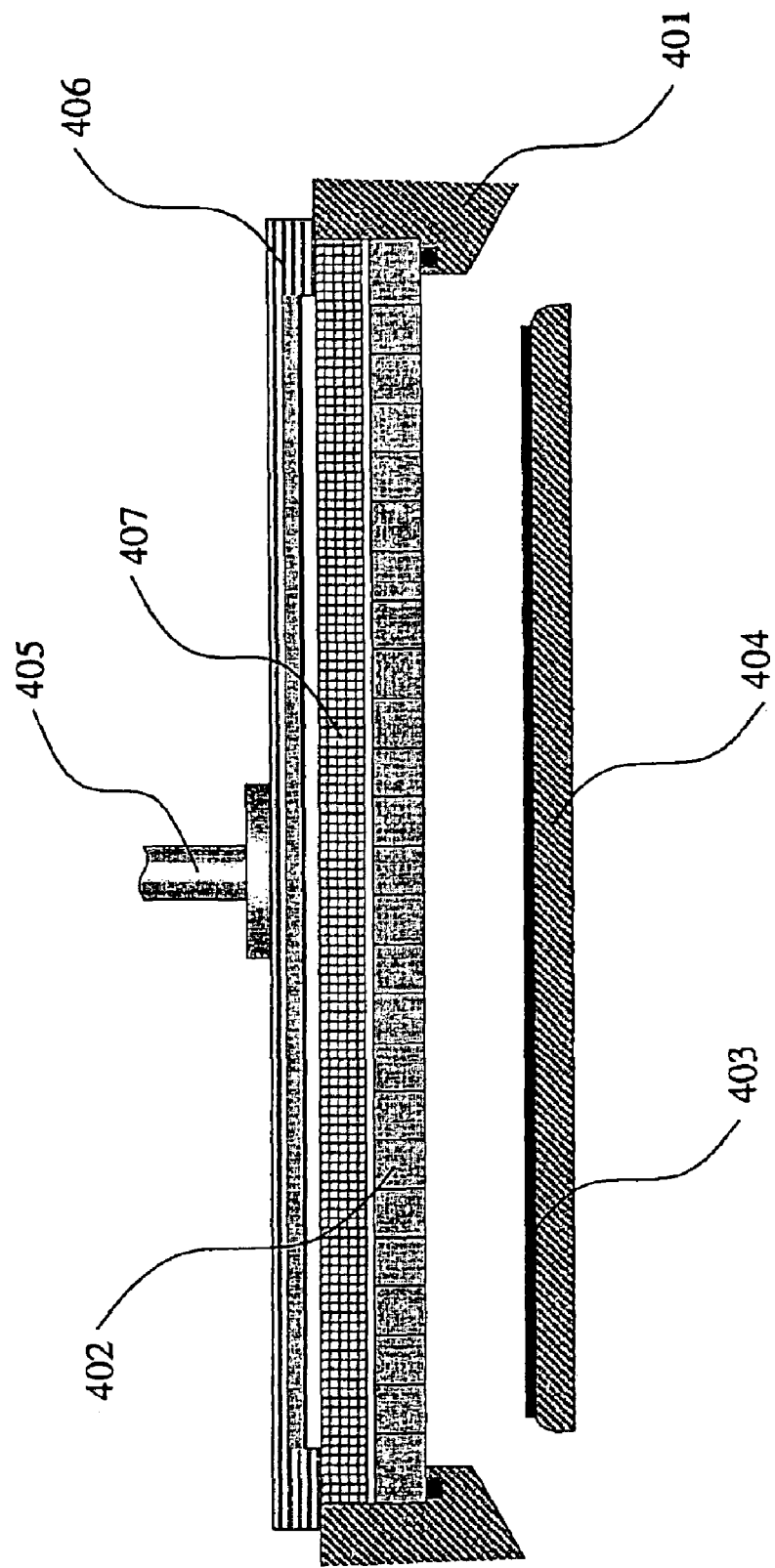
FIG. 4 is a schematic view showing a plasma apparatus that uses a radial line slot antenna.

FIG. 4 is a cross sectional diagram showing an example of the apparatus used for realizing the silicon gate oxide film of the MIS-type field effect transistor by using a radial line slot antenna (reference should be made to WO98/33362).

The silicon oxide film is formed as follows.

First, a vacuum vessel (processing chamber) 401 is evacuated to a vacuum state, and a Kr gas and an $O_2$ gas are introduced from a shower plate 402. With this, the pressure of the processing chamber is set to about 1 Torr.

Next, a silicon wafer 403 having a <110> surface orientation is placed on a stage 404 having a heating mechanism as a substrate, and the temperature of the specimen is set to about 400° C. It should be noted thereby that the results to be explained below are substantially the same as long as this temperature setting is in the range of 200–550° C.

Further, a microwave of 2.45 GHz is supplied to the processing chamber from a coaxial waveguide 405 through a radial line slot antenna 406 and a dielectric plate 407, and high-density plasma is induced in the processing chamber. Thereby, it should by noted that the results to be explained below are generally the same as long as the frequency of the supplied microwave is 900 MHz or higher but 10 GHz or lower.

It should be noted that the separation between the shower plate 402 and the substrate 403 is set to 6 cm in the present embodiment. By reducing this distance, a higher film formation rate becomes possible. While the present embodiment explains the example of forming a film by using a plasma apparatus that uses the radial line slot antenna, it should be noted that the microwave may be introduced into the processing chamber by way of other methods.

In the microwave-excited plasma in which a Kr gas and an $O_2$ gas are mixed, Kr* of intermediate excitation state cause collision with the $O_2$ molecules and atomic state oxygen O* are formed efficiently, while this atomic state oxygen causes the oxidation of the substrate surface. Conventionally, it should be noted that the oxidation of silicon surface has been caused by $H_2O$ molecules or $O_2$ molecules and a very high process temperature of 800° C. or more has been needed. In contrast, the oxidation of the present invention caused by the atomic state oxygen can be conducted at a substantially low temperature of 550° C. or less.

Figure 5:
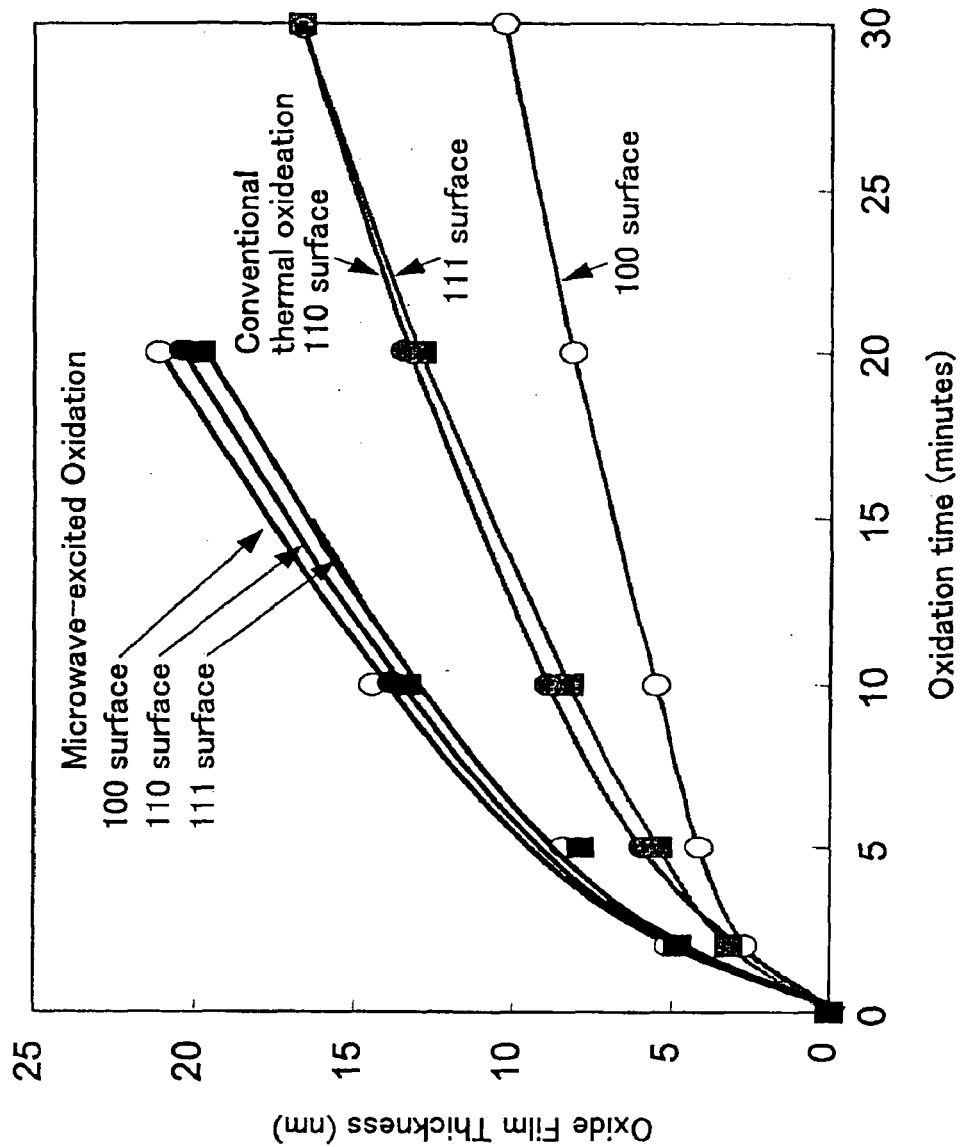
FIG. 5 is a diagram showing the dependence of the silicon oxide film thickness on the formation time for the case the silicon crystal surface is changed variously.

FIG. 5 shows the surface-orientation dependence of the relationship between the oxide film thickness and oxidation time at the time of oxidation of a silicon substrate surface by the microwave-induced $Kr/O_2$ plasma, wherein it should be noted that FIG. 5 shows the relationship for the (100) surface, (111) surface and the (110) surface of the silicon substrate. Further, FIG. 5 also shows the oxidation time dependence for the conventional dry thermal oxidation process conducted at 900° C.

In the conventional high temperature thermal oxidation technology, the $O_2$ molecules or $H_2O$ molecules penetrate through an oxide formed on the surface and the $O_2$ molecules or the $H_2O$ molecules thus penetrated through the oxide film and reached the silicon/silicon oxide film interface contributes to the oxidation. Thus, there appears a difference of growth rate depending on the surface orientation. In the case of the oxidation of the silicon substrate surface by the microwave-induced $Kr/O_2$ plasma, on the other hand, there can be seen no substantial dependence of growth rate of the silicon oxide film and this holds also to the surface orientations other than those shown in FIG. 5.

Further, the result of measurement of the interface state density at the silicon oxide film/silicon interface conducted by way of low-frequency C-V measurement has revealed the fact that the interface state density of the silicon film thus formed by the microwave-excited plasma is low in any of the (100) surface, (111) surface, (110) surface, as well as in any other surface orientations.

As explained above, the silicon oxide film thus formed by the microwave-excited $Kr/O_2$ plasma has equivalent or superior electric characteristics to the conventional high-temperature oxide film formed on the (100) surface, in any of the (100) surface, (111) surface, (110) surface, or any other surfaces, in spite of the fact that oxidation is conducted at a low temperature such as 400° C.

It should be noted that the existence of Kr in the silicon oxide film immediately after the film formation also contributes to the foregoing desirable effect. As a result of incorporation of Kr in the silicon oxide film, stress existing inside the film or existing at the $Si/SiO_2$ interface is relaxed, and this leads to the foregoing significant improvement of electric characteristics of the silicon oxide film as a result of reduction of trapped charges or interface state density. Particularly, existence of Kr of $5 \times 10^{11}$ cm$^2$ or less in terms of surface density contributes to the improvement of electric characteristics and reliability of the silicon oxide film. It should be noted that FIGS. 2 and 3 show the surface orientation dependency of mobility of the MIS transistor having the gate insulation film formed according to such a process.

In the present invention, it is sufficient that the silicon oxide film formed by the microwave-excited plasma exists at least at the part contacting to silicon, and thus, it is possible to use an insulation film in which a different material such as a silicon nitride film, aluminum oxide film, tantalum oxide film, hafnium oxide film, zirconium oxide film, and the like, is laminated on the silicon oxide film. Further, it is possible to use any other plasma processing apparatus that enables low temperature oxide film formation by using plasma.

For example, it is possible to use a plasma processing apparatus of two-stage shower plate type having first gas release means for releasing a Kr gas for exciting plasma by a microwave and a second gas release means different from the first gas release means for releasing an oxygen gas.

Further, it should be noted that the silicon wafer of the <110> surface orientation may be any of a bulk crystal wafer or a silicon-on-insulator (SOI) wafer in which a silicon layer is formed on a buried insulation film. Further, there may be a silicon body or a metal layer underneath the buried insulation film of the SOI wafer. An SOI wafer having a low-resistance metal layer such as Cu underneath the buried insulation film is advantageous for high-speed operation.

[Embodiment 2]

Next, description will be made on a semiconductor device in which a MIS-type field-effect transistor including therein a silicon oxynitride film is provided on a silicon substrate having the <110> orientation.

In the case of forming a field effect transistor that uses a silicon nitride film for the gate insulation film, too, the mobility becomes maximum in the construction in which the field effect transistor is formed on a <110> oriented silicon substrate shown in FIG. 1 such that the uppermost silicon atoms of the silicon substrate are arranged parallel to the interface to the gate insulation film and the gate electrode is disposed so as to extend from the right to the left of the drawing plane, and the source region is disposed closer to the plane of drawing and the drain region is disposed farther to the plane of the drawing.

It should be noted that the current drivability of the foregoing MIS transistor disposed with such an orientation increases in correspondence to the increase of dielectric constant of the silicon nitride film with respect to the silicon oxide film. More specifically, it was observed that the current drivability has increased by the factor of about 1.6 as compared with the MIS transistor having a silicon oxide film and formed on the (100) surface for the case of the N-type transistor. In the case of the P-type transistor, the mobility has increased by the factor of about 2.8. The reason of such an increase of mobility of the MIS transistor disposed in the foregoing orientation is attributed to the decrease of the effective mass of electrons and holes in the region along the source region and the drain region and the decrease of lattice scattering probability, similarly to the case of the first embodiment.

Further, similarly to the case of the first embodiment, it is also possible to form the field effect transistor of the present invention on surfaces having a surface angle orientation substantially equal to or close to the (110) surface or the <110> surfaces, such as a (551) surface, a (331) surface, a (221) surface, a (321) surface, a (531) surface, a (231) surface, a (351) surface, a (320) surface, a (230) surface, and the like.

Similarly to the first embodiment, the gate silicon-oxynitride film of the MIS transistor of the present invention is realized by the microwave excited plasma apparatus that uses the radial line slot antenna of FIG. 4.

The silicon oxynitride film is formed as follows.

First, the vacuum vessel (processing chamber) 401 is evacuated to a vacuum state and a Kr gas, an $O_2$ gas and a NH3 gas are introduced from the shower plate 402 such that the pressure of the processing chamber is set to about 1 Torr.

Next, the silicon wafer 403 of the <110> surface orientation is placed on the stage 404 having a heating mechanism as a substrate, and the temperature of the specimen is set to about 400° C.

Further, a microwave of 5.45 GHz is introduced into the processing chamber from the coaxial waveguide 405 via the radial line slot antenna 406 and the dielectric plate 407, and high density plasma is induced in the processing chamber. Thereby, the gap between the shower plate 402 and the substrate 43 is set to about 6 cm.

While the present embodiment describes the example that conducts the film formation by using a plasma apparatus that uses a radial line slot antenna, the microwave may be introduced by other means.

In high-density excited plasma in which the Kr gas, $O_2$ gas and the $NH_3$ gas are mixed, Kr* of intermediate state cause collision with the $O_2$ molecules and the $NH_3$ molecules and atomic state oxygen O* and NH* are formed efficiently, while the radicals thus excited cause the oxynitridation of the silicon substrate surface.

In such oxynitridation of the silicon surface that uses microwave-excited plasma, there appears almost no surface orientation dependence on the growth rate of the oxynitride film. Further, the surface state density at the silicon oxynitride film/silicon interface is low in any of the (100) surface, (111) surface, (110) surface, or in any of other surface orientations.

In order to realize the oxynitride film of the present invention, it is also possible to use another plasma processing apparatus that enables formation of oxynitride film at low temperature by using plasma, in addition to the apparatus of FIG. 4.

For example, it is possible to construct the apparatus by way of the plasma processing apparatus of the foregoing two-stage shower plate type in which the first gas release means releasing the Kr gas for plasma formation and the second, additional gas release means for releasing the oxygen gas are provided.

In the formation of the silicon oxynitride film of the present invention, the existence of hydrogen forms one important factor.

As a result of existence of hydrogen in the plasma, the dangling bonds in the silicon nitride film or at the interface are terminated in the form of Si—H bond or N—H bond, and as a result, trapping of electron in the silicon oxynitride film or by the interface is eliminated. Thereby, it should be noted that existence of Si—H bond or N—H bond in the oxynitride film of the present invention is confirmed by measurement of infrared absorption spectrum and X-ray electron spectroscopic spectrum. As a result of existence of hydrogen, the hysteresis of the C-V characteristics is eliminated and the interface state density at the silicon/silicon oxynitride film is suppressed to $3 \times 10^{10}$ $cm^{-2}$ or less. In the case of forming a silicon oxynitride film by using a rare gas (Ar or Kr) and the mixed gas of $O_2$, $N_2/H_2$, trapping of electrons and holes in the film is reduced sharply by setting the partial pressure of hydrogen to 0.5% or more.

In the present invention, too, it is sufficient that the silicon oxynitride film formed by the microwave-excited plasma exists at least at the part contacting to silicon, and thus, it is possible to use an insulation film in which a different material such as a silicon nitride film, aluminum oxide film, tantalum oxide film, hafnium oxide film, zirconium oxide film, and the like, is laminated on the silicon oxynitride film.

In order to realize the oxynitride film of the present invention, it is possible to use any other plasma processing apparatus that enables low temperature oxide film formation by using plasma in addition to the apparatus of FIG. 4. For example, it is possible to use a plasma processing apparatus of the two-stage shower plate type having the first gas release means for releasing a Kr gas for exciting plasma by a microwave and the second gas release means different from the first gas release means for releasing the $O_2$, $NH_3$ (or $N_2/H_2$ gas).

[Third Embodiment]

Next, description will be made on a semiconductor device in which a MIS transistor having a silicon nitride film is formed on a silicon substrate having a <110> orientation as a third embodiment of the present invention.

In the case of forming a field effect transistor that uses a silicon nitride film for the gate insulation film, too, the construction formed on the silicon substrate having the <110> orientation in such a manner that the uppermost silicon atoms are arranged parallel to the interface to the gate insulation film and the gate electrode is provided so as to extend from the right to the left in the plane of the drawing, the source region is provided closer with respect to the plane of the drawing and the drain region is provided farther with respect to the plane of the drawing, provides the maximum mobility.

In the MIS transistor disposed in this orientation, the current drivability is increased further in correspondence to the increase of the dielectric constant of the silicon nitride film with respect to the silicon oxide film. It should be noted that the silicon nitride film of the present embodiment has a dielectric constant of about twice as large as that of the silicon oxide film. Further, the current drivability of the field effect transistor was about 2.8 times as large as the MIS transistor in which a silicon oxide film is formed on the (100) surface for the case of N-type. In the case of P-type, the current drivability has increased by 5 times.

Similarly to the first embodiment, the increase of drivability of the MIS transistor disposed with this orientation is attributed to the decrease of effective mass of electrons and holes along the source region and the drain region and decrease of the lattice scattering probability.

Similarly to the first embodiment, the field effect transistor of the present invention may be formed also on substantially (110) surfaces or surfaces having a surface orientation angle equal to or close to the <110> surface, such as a (551) surface, a (331) surface, a (221) surface, a (321) surface, a (532) surface, a (231) surface, a (351) surface, (a 320) surface, a (230) surface, and the like.

Similarly to the first embodiment, the gate silicon nitride film of the MIS transistor of the present invention is realized by the microwave excited plasma apparatus that uses the radial line slot antenna of FIG. 4.

The silicon nitride film is formed as follows.

First, the vacuum vessel (processing chamber) 401 is evacuated to a vacuum state and a Kr gas, a $NH_3$ gas is introduced from the shower plate 402 such that the pressure of the processing chamber is set to about 1 Torr.

Next, the silicon wafer 403 of the <110> surface orientation is placed on the stage 404 having a heating mechanism as a substrate, and the temperature of the specimen is set to about 400° C.

Further, a microwave of 2.45 GHz is introduced into the processing chamber from the coaxial waveguide 405 via the radial line slot antenna 406 and the dielectric plate 407, and high density plasma is induced in the processing chamber. Thereby, the gap between the shower plate 402 and the substrate 43 is set to about 6 cm.

While the present embodiment describes the example that conducts the film formation by using a plasma apparatus that uses a radial line slot antenna, the microwave may be introduced by other means.

In high-density excited plasma in which the Kr gas and the $NH_3$ gas are mixed, Kr* of intermediate excitation state cause collision with the $NH_3$ molecules and NH* are formed efficiently, while the radicals thus excited cause the nitridation of thesilicon substrate surface.

In such nitridation of the silicon surface that uses microwave-excited plasma, there appears almost no surface orientation dependence on the growth rate of the nitride film. Further, the surface state density at the silicon nitride film/silicon interface is low in any of the (100) surface, (111) surface, (110) surface, or in any of other surface orientations.

In order to realize the nitride film of the present invention, it is also possible to use another plasma processing apparatus that enables formation of nitride film at low temperature by using plasma, in addition to the apparatus of FIG. 4.

For example, it is possible to construct the apparatus by way of the plasma processing apparatus of the foregoing two-stage shower plate type in which the first gas release means releasing the Kr gas for plasma formation and the second, additional gas release means for releasing the oxygen gas are provided.

In the formation of the silicon nitride film of the present invention, the existence of hydrogen forms one important factor.

As a result of existence of hydrogen in the plasma, the dangling bonds in the silicon nitride film or at the interface are terminated in the form of Si—H bond or N—H bond, and as a result, trapping of electron in the silicon nitride film or by the interface is eliminated. Thereby, it should be noted that existence of Si—H bond or N—H bond in the nitride film of the present invention is confirmed by measurement of infrared absorption spectrum and X-ray electron spectroscopic spectrum.

As a result of existence of hydrogen, the hysteresis of the C-V characteristics is eliminated and the interface state density at the silicon/silicon nitride film is suppressed to $3 \times 10^{10}$ cm$^{-2}$ or less. In the case of forming a silicon oxynitride film by using a rare gas (Ar or Kr) and the mixed gas of $N_2/H_2$, trapping of electrons and holes in the film is reduced sharply by setting the partial pressure of hydrogen to 0.5% or more.

In the present invention, too, it is sufficient that the silicon nitride film formed by the microwave-excited plasma exists at least at the part contacting to silicon, and thus, it is possible to use an insulation film in which a different material such as a silicon oxide film, aluminum oxide film, tantalum oxide film, hafnium oxide film, zirconium oxide film, and the like, is laminated on the silicon nitride film.

In order to realize the nitride film of the present invention, it is possible to use any other plasma processing apparatus that enables low temperature oxide film formation by using plasma in addition to the apparatus of FIG. 4. For example, it is possible to use a plasma processing apparatus of the two-stage shower plate type having the first gas release means for releasing a Kr gas for exciting plasma by a microwave and the second gas release means different from the first gas release means for releasing the $NH_3$ (or $N_2/H_2$ gas).

INDUSTRIAL APPLICABILITY

According to the present invention, it becomes possible to provide a field effect transistor of high mobility, by forming a MIS transistor such that the MIS transistor uses a gate insulation film of a silicon oxide film, silicon oxynitride film or a silicon nitride film, formed on a silicon substrate or a silicon surface having substantially a <110> surface orientation, in such a manner that the direction connecting the source region and the drain region becomes substantially coincident to the <110> surface direction.

Further, according to the present invention, it becomes possible to increase the current drivability of a transistor up to five times the current drivability of a conventional transistor that uses a silicon gate oxide film, without miniaturizing the device, by forming the MIS transistor having particularly a silicon nitride film on a silicon substrate or silicon surface having a substantially <110> orientation, for the gate insulation film, such that the direction connecting the source region and the drain region coincides substantially with the <110> surface direction. As a result, the MIS transistor of the present invention is operable at high speed without deteriorating the breakdown characteristics, and it becomes possible to increase the product of high-frequency cutoff frequency and device breakdown voltage (fT.BVbd product) of a silicon CMOS integrated circuit up to five times as compared with the conventional case. This means that it has become possible to realize a high-speed integrated circuit exceeding a silicon germanium transistor or a gallium arsenide transistor while using a silicon CMOS device. Further, by increasing the channel width five times without changing the channel length of the MIS transistor, it becomes possible to reduce the device area by ½ or less as compared with the conventional MIS transistor having a silicon gate oxide film formed on a (100) surface, without sacrificing the current drivability. Thereby, it becomes possible to realize a low power integrated circuit in which the power consumption is reduced to ¼. Further, by increasing the channel length five times without changing the channel width in the MIS transistor, it becomes possible to reduce the variation of the threshold voltage to ½ or less, the 1/f noise to ½ or less, and the thermal noise to ½ or less as compared to the conventional MIS transistor that has a silicon gate oxide film on the (100) surface, without sacrificing the current drivability. Thereby, a high-precision integrated circuit can be formed.

What is claimed is:

1. A semiconductor device comprising:

a plurality of field effect transistors formed on an unstrained silicon surface having substantially a <110> orientation, the plurality of field effect transistors each having a gate insulator film containing krypton atoms with a surface density of up to $5 \times 10^{11}$ cm$^{-2}$, wherein the field effect transistors are disposed on the silicon surface such that a direction connecting a source region and a drain region of said field effect transistor is coincident to a substantially <110> direction, and wherein the field effect transistors have an electron mobility at least about 1.4 times greater than an electron mobility of a field effect transistor formed in the same manner on a silicon surface having substantially a <100> orientation.

2. The semiconductor device as claimed in claim 1, wherein a gate insulation film contacting silicon is formed of any of a silicon oxide film, a silicon oxymtride film and a silicon nitride film.

3. The semiconductor device as claimed in claim 1, wherein one or more of the field effect transistors are N-type metal-insulator-silicon transistors.

4. The semiconductor device as claimed in claim 1, wherein one or more of the field effect transistors are P-type metal-insulator-silicon transistors.

5. The semiconductor device as claimed in claim 4, wherein said P-type transistors have an electron mobility at least about 2.5 times greater than an electron mobility of a P-type metal-insulator-silicon transistor formed in the same manner on a silicon surface having substantially a <100> orientation.

6. The semiconductor device of claim 1, wherein the gate insulator film is a silicon oxide film.

7. A fabrication method of a semiconductor device including therein a plurality of field effect transistors on an unstrained silicon surface having substantially a <110> orientation in such a manner that the direction connecting a source region and a drain region of the field effect transistor is coincident to a substantially <110> direction, comprising:

forming a gate insulation film of the field effect transistor by using a mixed gas plasma of krypton and an insulation film forming gas, the mixed gas plasma being formed by microwave excitation, wherein the gate insulation film contains krypton atoms at a surface density of up to $5 \times 10^{11}$ cm$^{-2}$.

8. The semiconductor device fabrication method as claimed in claim 7, wherein said insulation film forming gas is any of ammonia, nitrogen/oxygen, oxygen, and a mixed gas thereof.

9. The method of claim 7, wherein the insulation film forming gas is oxygen.

* * * * *